US008305759B2

(12) United States Patent
Attlesey et al.

(10) Patent No.: US 8,305,759 B2
(45) Date of Patent: Nov. 6, 2012

(54) GRAVITY ASSISTED DIRECTED LIQUID COOLING

(75) Inventors: Chad Daniel Attlesey, Rochester, MN (US); Scott Williamson, Rochester, MN (US); Wayne Fjerstad, Rochester, MN (US)

(73) Assignee: Hardcore Computer, Inc., Rochester, MN (US)

( * ) Notice: Subject to any disclaimer, the term of this patent is extended or adjusted under 35 U.S.C. 154(b) by 341 days.

(21) Appl. No.: 12/714,904

(22) Filed: Mar. 1, 2010

(65) Prior Publication Data

US 2010/0226094 A1  Sep. 9, 2010

Related U.S. Application Data

(60) Provisional application No. 61/158,437, filed on Mar. 9, 2009.

(51) Int. Cl.
*H05K 7/20* (2006.01)
*F28F 7/00* (2006.01)

(52) U.S. Cl. ............ 361/701; 165/80.4; 361/699
(58) Field of Classification Search .......... 361/696
See application file for complete search history.

(56) References Cited

U.S. PATENT DOCUMENTS

| | | | |
|---|---|---|---|
| 4,698,728 A * | 10/1987 | Tustaniwskyj et al. | 361/699 |
| 5,943,211 A * | 8/1999 | Havey et al. | 361/699 |
| 6,504,719 B2 * | 1/2003 | Konstad et al. | 361/698 |
| 6,828,675 B2 * | 12/2004 | Memory et al. | 257/714 |
| 7,403,392 B2 | 7/2008 | Attlesey et al. | |
| 7,414,845 B2 | 8/2008 | Attlesey et al. | |
| 7,609,518 B2 | 10/2009 | Hopton et al. | |
| 7,724,517 B2 | 5/2010 | Attlesey et al. | |
| 7,724,524 B1 | 5/2010 | Campbell et al. | |
| 2002/0117291 A1 * | 8/2002 | Cheon | 165/80.4 |
| 2005/0047083 A1 * | 3/2005 | Kondo et al. | 361/689 |
| 2005/0168948 A1 * | 8/2005 | Cader et al. | 361/699 |
| 2007/0289719 A1 * | 12/2007 | Chu et al. | 165/80.4 |
| 2008/0017355 A1 | 1/2008 | Attlesey et al. | |
| 2008/0196870 A1 | 8/2008 | Attlesey et al. | |
| 2009/0260777 A1 | 10/2009 | Attlesey et al. | |
| 2010/0101759 A1 | 4/2010 | Campbell et al. | |

(Continued)

FOREIGN PATENT DOCUMENTS

CA  2646237  6/2010

(Continued)

OTHER PUBLICATIONS

"Green Revolution Cooling CarnotJet System" video by Green Revolution Cooling, located online at http://www.youtube.com/watch?v=-q0sTFXIDFM and accessed Jun. 23, 2010.

(Continued)

*Primary Examiner* — Gregory Thompson
(74) *Attorney, Agent, or Firm* — Hamre, Schumann, Mueller & Larson, P.C.

(57) ABSTRACT

Dielectric liquid is used to cool heat generating electronic components disposed on a circuit board within a case. The liquid is poured or otherwise directed over the electronic components, with gravity assisting the liquid in flowing downward over the components, with the liquid thereafter being collected in a sump for eventual return back to the electronic components. One exemplary application of the described concepts is in cooling electronic components in computers, for example personal computers or server computers.

4 Claims, 7 Drawing Sheets

U.S. PATENT DOCUMENTS

| | | |
|---|---|---|
| 2010/0101765 A1 | 4/2010 | Campbell et al. |
| 2010/0103614 A1 | 4/2010 | Campbell et al. |
| 2010/0103618 A1 | 4/2010 | Campbell et al. |
| 2010/0103620 A1 | 4/2010 | Campbell et al. |

FOREIGN PATENT DOCUMENTS

| | | |
|---|---|---|
| WO | 2010/019517 | 2/2010 |

OTHER PUBLICATIONS

"Liquid Cooled Server Rack" video by Iceotope, located online at http://www.youtube.com/watch?v=K5e9_cqFiNE and accessed Jun. 23, 2010.

U.S. Appl. No. 12/795,854, filed Jun. 8, 2010 (40 pages).

"Green Revolution Cooling: The most efficient data center cooling solution available" by Green Revolution Cooling, Inc., 2009, (2 pages).

Donoghue, Andrew, "Server Cool-Bags Could Cut Costs by 93 Percent," eWEEK Europe UK, located at http://www.eweekeurope.co.uk/news/news-it-infrastructure/server-cool-bags-could-cut-costs-by-93-percent-2472, Nov. 17, 2009, (3 pages).

Dillow, Clay, "Liquid Cooling Bags for Data Centers Could Trim Costs and Carbon by 90 Percent," Popular Science, located at http://www.popsci.com/science/article/2009-11/liquid-coolant-system-data-centers-could-trim-cost-carbon-90-percent, Nov. 17, 2009 (3 pages).

\* cited by examiner

GRAVITY ASSISTED DIRECTED LIQUID COOLING

This application claims the benefit of U.S. Provisional Application No. 61/158,437 filed Mar. 9, 2009, which is incorporated by reference herein in its entirety.

FIELD

This disclosure relates to liquid cooling of heat generating electronic components and systems.

BACKGROUND

The use of liquids to cool heat generating electronic components is known as a more effective means to remove heat compared with the use of air cooling. Liquids have been disclosed as a cooling medium in a number of electronic systems, for example computer devices such as personal computers and servers, data storage devices, power supplies, among others. Examples of using liquid to cool electronic components and devices are described in U.S. Pat. No. 7,403,392.

Further advancements in liquid cooling of heat generating electronic components would be beneficial.

SUMMARY

This application describes the use of dielectric liquid to cool heat generating electronic components. The liquid is poured or otherwise directed over the electronic component, with gravity assisting the liquid to flow downward over the component, with the liquid thereafter being collected in a sump for eventual return back to the electronic component.

The concepts described herein have applications in cooling electronic components in electronic devices in general, such as industrial equipment and commercial electronics. One exemplary application of the described concepts is in cooling electronic components in computers, for example personal computers or server computers.

In one example, dielectric cooling is directed onto an electronic component mounted on a circuit board that is disposed within a case. The circuit board is oriented, for example vertically, within the case such that gravity assists the liquid in flowing over the component thereby cooling the component. The liquid is eventually returned to a sump area at the bottom of the case where it is collected and eventually pumped to an external heat exchanger disposed outside the case. The heat exchanger cools the liquid and the liquid is then returned into the case to be directed onto the electronic component.

The liquid flow over the component can be uncontrolled, controlled using a plenum disposed over the component, or a combination of uncontrolled and controlled. Further, cooling liquid can be directed over multiple components at the same time.

In one example, a deflector plate can be mounted on the circuit board to enhance the visual effect of the liquid flowing down the circuit board within the case.

In another example, a power supply can be mounted on the circuit board, and one or more deflectors provided on the power supply to deflect liquid into the interior of the power supply and onto internal components of the power supply needing cooling.

The concepts described herein provide a number of advantages. For example, an enclosed system is utilized which provides direct contact liquid cooling of electronic components. In addition, electronic packaging densities can be increased due to higher efficiency heat removal compared to conventional air cooling. Further, electronic systems employing the described concepts operate more quietly due to reduced dependency of air cooling devices.

Additionally, electronic systems employing the described concepts have lower weight, lower cost and lower complexity compared to fully liquid submerged systems such as the system disclosed in U.S. Pat. No. 7,403,392. Since the electronic components described herein are not submerged, the back pressure on the liquid flow as seen in a fully submerged design, such as disclosed in U.S. Pat. No. 7,403,392, does not exist and more flow can be achieved.

Further, the described system allows for visual verification that the cooling system is operating. In one example, indicators can be provided that are indicative of pump speed, so that based on visual observation of the fluid stream one could discern if the pump is operating at, for example, 25%, 50% or full speed.

In another example, visual indicators can be added to visually indicate the effectiveness of the cooling. For example, thermal sensitive liquid crystals can be added to certain locations, such as non-cooled regions on the circuit board, to create a visual verification of adequate cooling.

DETAILED DESCRIPTION

A system is described that uses dielectric liquid to cool heat generating electronic components. The liquid is poured or otherwise directed over the electronic component, with gravity assisting the liquid in flowing over the component, with the liquid thereafter being collected in a sump for eventual return back to the electronic component.

The concepts described herein have applications in cooling electronic components in electronic devices in general, such as industrial equipment and commercial electronics. One exemplary application of the described concepts is in cooling electronic components in computers, for example personal computers or server computers. Other examples of electronic devices to which the concepts described herein can be applied include, but are not limited to, console gaming devices, handheld devices such as tablet computers, wearable computers and personal digital assistants (PDAs); disk arrays/storage systems; storage area networks; storage communication systems; work stations; routers; telecommunication infrastructure/switches; wired, optical and wireless communication devices; cell processor devices; printers; power supplies; displays; optical devices; instrumentation systems including hand-held systems; military electronics; etc.

The concepts will be described and illustrated herein as applied to a desktop-sized personal computer. However, it is to be realized that the described concepts could be used on other electronic devices as well.

Figure 1:
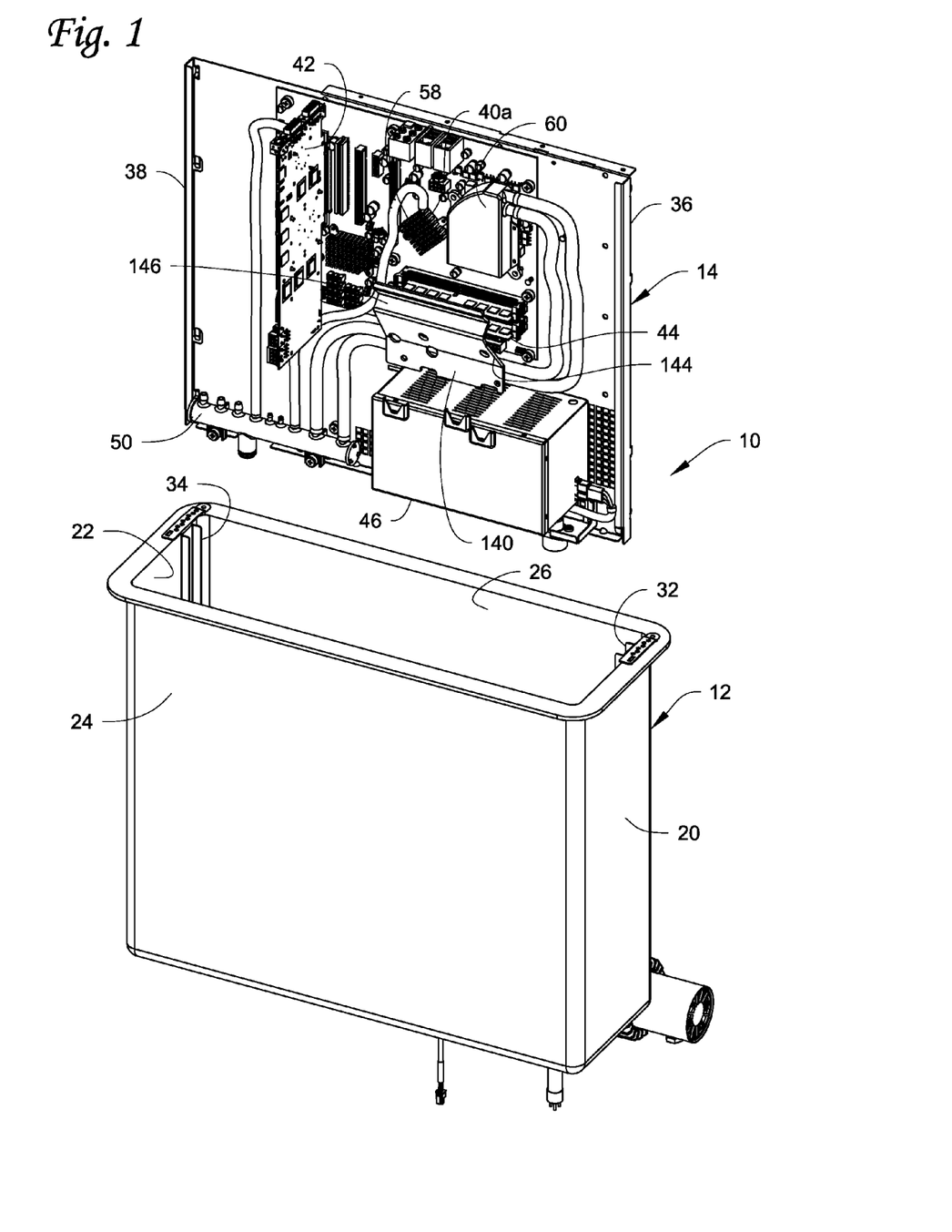
FIG. 1 is an exploded, front perspective view of a computer employing the liquid cooling described herein.
Figure 2:
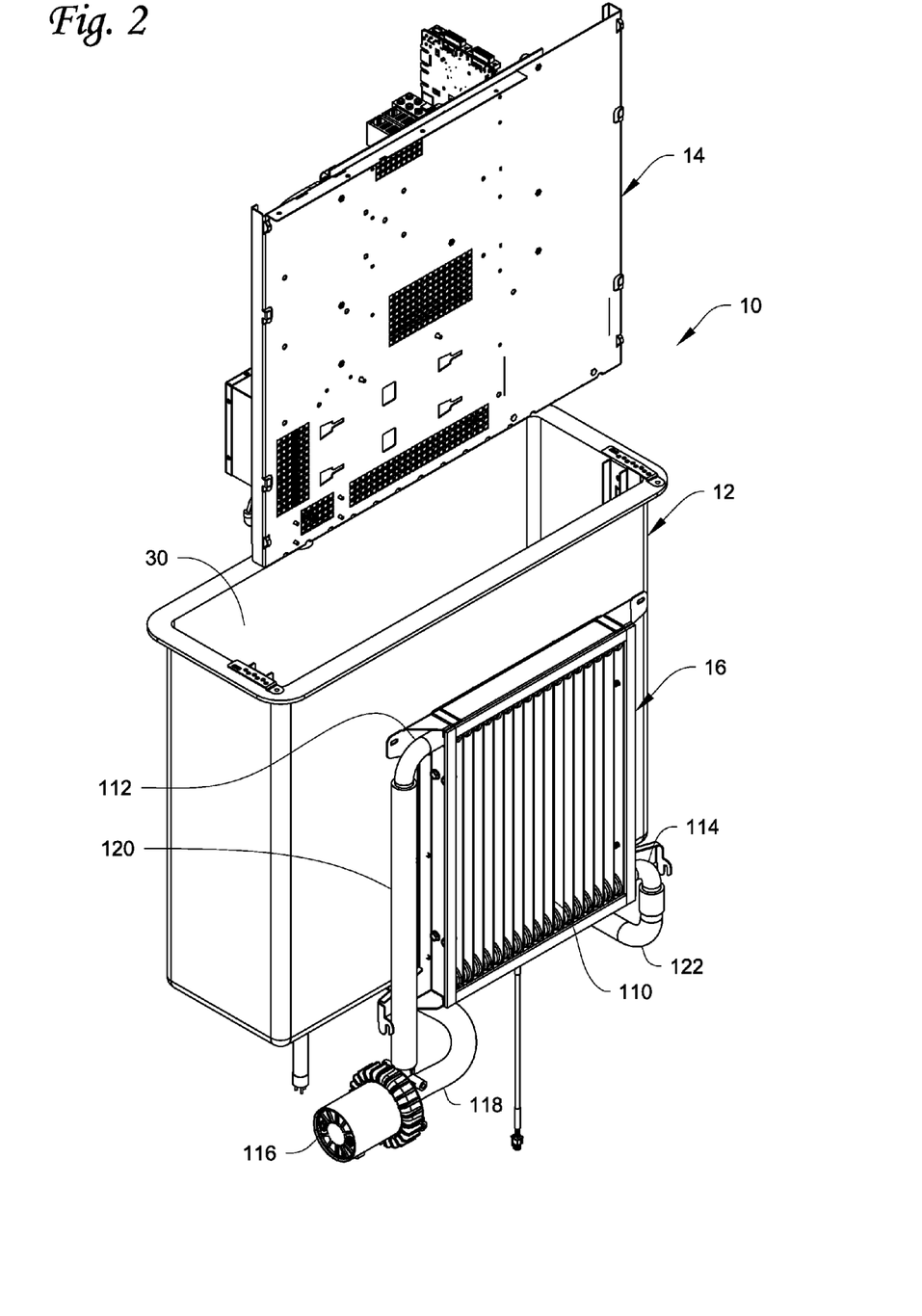
FIG. 2 is an exploded, rear perspective view of the computer of FIG. 1.

FIGS. 1-2 illustrate an example of a computer 10 employing the liquid cooling concepts described herein. The cooling liquid employed is a dielectric liquid. Dielectric liquids that can be used include, but are not limited to:

Engineered fluids like 3M™ Novec™
Mineral oil
Silicone oil
Natural ester-based oils, including soybean-based oils
Synthetic ester-based oils The computer 10 includes a case 12, a circuit board 14 on which the computer electronic components are mounted, and a heat exchange unit 16. The case 12 is designed to receive the circuit board 14 therein during use, and the heat exchange unit is designed to reduce the temperature of cooling liquid that is pumped from inside the case, cooled, and then directed back into the case.

The case 12 includes end walls 20, 22, a front wall 24, a rear wall 26, and a bottom wall 28 (FIG. 4) which in the illustrated example define a rectangular case with an interior space 30. However, the case 12 can have shapes other than rectangular. The case 12 can be made of, for example, plastic, glass or metal. The front wall 24 (and if desired the end walls and the rear wall) can be made of translucent, or transparent or clear, plastic to permit the viewing of the circuit board 14 and the electronic components mounted thereon which is disposed in the interior space 30 of the case 12. The material used for the case can be any material suitable for forming a leak-proof container and, if viewing of the internal computer components is desired, the material of at least the front wall 24 should be translucent or transparent.

During use the top of the case 12 will be closed by a removable lid (not shown) which can seal with the case to make the case liquid tight. In one example, the lid can be connected to the circuit board 14 so that the lid and circuit board are removable as a unit. An example of a removable lid on a case that is connected to a circuit board is disclosed in U.S. Pat. No. 7,403,392 which is incorporated herein by reference in its entirety.

Mounted on each end wall 20, 22 within the case 12 is a track 32, 34. Each track 32, 34 extends from the top of the end walls to the bottom, and are continuous from top to bottom. As shown in FIGS. 1 and 2, the circuit board has side edges 36, 38 that are sized and configured to be received by and slide within the tracks 32, 34. The tracks and the side edges help guide the circuit board 14 when it is lifted upward from the case 12 and when it is lowered back into the interior space 30.

With reference to FIGS. 1-2 and 4-5, the circuit board is illustrated as being oriented vertically within the interior space of the case 12. However, the circuit board can be mounted in any orientation within the case 12, for example at 45 degrees or even horizontally. The circuit board 12 can be at any orientation where gravity assists the liquid in flowing over the component and assists in returning the liquid to the bottom of the case.

The circuit board 14 has a number of electronic components mounted thereon, which in the illustrated example function to operate as a personal computer 10. The components include one or more processors (CPUs and/or GPUs) 40a, 40b a video/graphics card 42, memory cards 44, and a power supply 46. Other electronic components necessary for the performance of a personal computer can also be mounted on the circuit board.

A fluid distribution system is provided on the circuit board for distributing cooling liquid to one or more of the electronic components on the circuit board. In the illustrated example, the fluid distribution system distributes cooling liquid to the video/graphics card 42 and to the processors 40a, 40b. The cooling liquid is directed onto the video card and the processors, and then flows downward over the video card and the processors to pick up heat from the video card and processors, and then flows down to the bottom of the case 12 into a sump area 48 defined generally at the bottom of the case 12.

Figure 4:
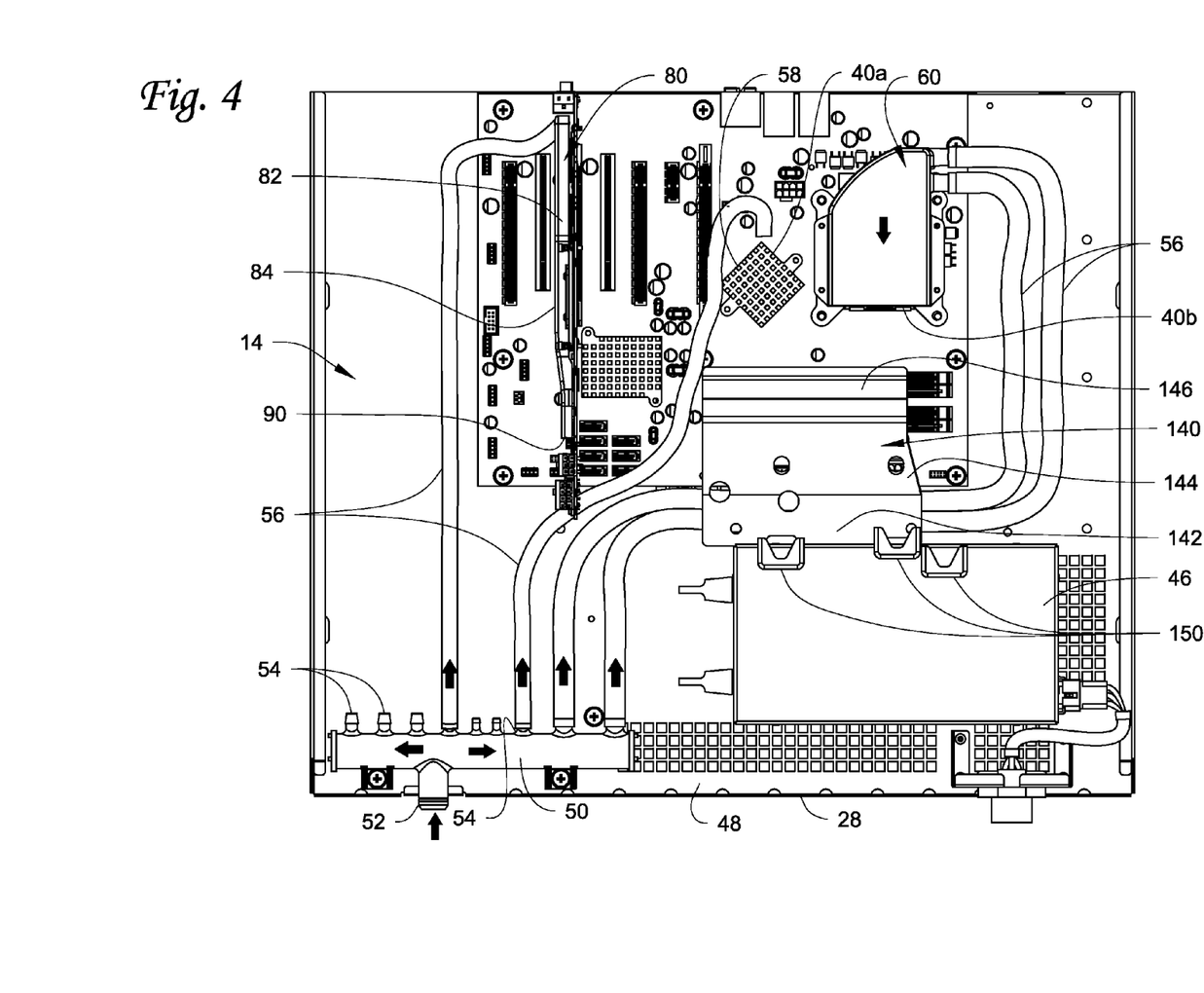
FIG. 4 is a front view of the computer showing the circuit board disposed in the case and showing various liquid flow paths.
Figure 5:
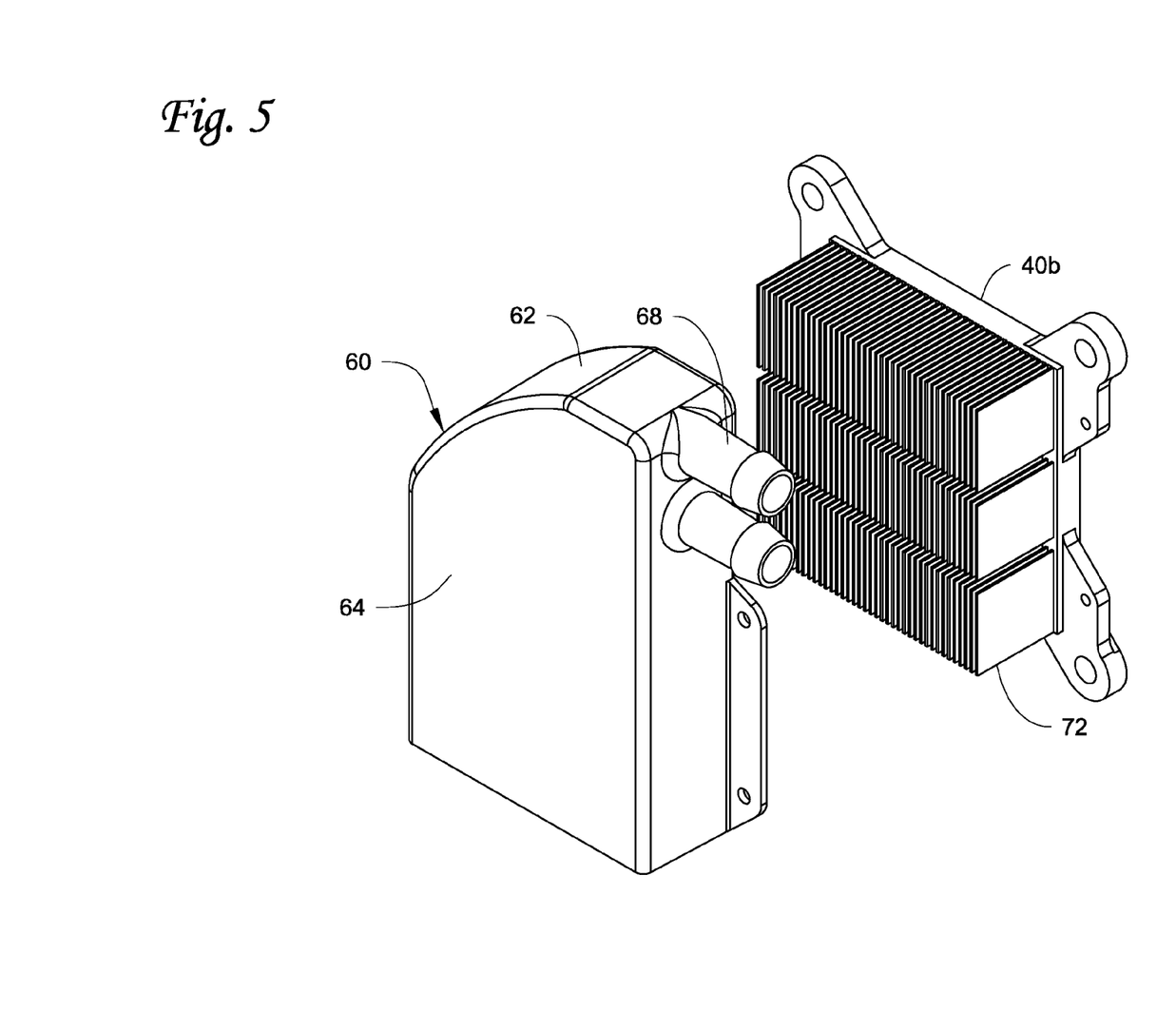
FIG. 5 shows the processor plenum and processor of the computer.

With reference to FIG. 4, the fluid distribution system includes a manifold 50 mounted adjacent the bottom of the circuit board 14. The manifold 50 includes a liquid inlet port 52 and a plurality of outlet ports 54. Extending from a number of the outlet ports 54 are flexible tubes 56 that extend upwardly toward the electronic component to be cooled. The example illustrated in FIG. 4 shows four tubes 56 extending upwardly to the video/graphics card 42 and the processors 40a, 40b. However, a larger or smaller number of tubes can be used, and the tubes can extend to the same or different components, or combinations of different components, depending upon the cooling requirements of the components and the desired cooling effect one is seeking to achieve. Those outlet ports 54 that are not connected to a tube are closed, for example by a valve, to prevent exit of liquid through the outlet ports.

The liquid from the tubes 56 can be directed over the electronic components in a number of ways. For example, as illustrated with respect to the processor 40a in FIG. 4, the outlet of the tube 56 can be positioned above the processor 40a and discharge liquid over and onto the processor 40a in what will be referred to herein as uncontrolled flow. The liquid then flows downwardly over the processor 40a, picking up heat from the processor 40a, and then continuing to flow down toward the bottom of the case 12 ultimately ending up being collected in the sump area 48.

To facilitate heat exchange, the processor 40a can be provided with cooling pins 58 which are in contact with and direct heat away from the processor 40a and increase the surface area for heat exchange. The pins 58 help disturb the boundary layer at the surface of the processor 40a, which helps to increase the efficiency of heat transfer from the processor 40a. If one determines that the configuration of the surface of the processor 40a adequately disturbs the boundary layer, or that adequate heat transfer is achieved without disturbing the boundary layer, then the pins or other heat exchange devices need not be used.

In this example of the processor 40a with uncontrolled flow, the liquid flow over the processor 40a is relatively uncontrolled in that the liquid is free to flow in any direction (for example sideways or forward) after it exits the tube 56. Therefore, some of the liquid may not come into contact with the processor or it may remain in contact with the processor 40a for a relatively short period of time, thereby limiting the efficiency of the cooling. Nonetheless, the liquid does cool the processor 40a. This concept of uncontrolled flow can be used with the processor 40b, with the video/graphics card 42, and/or with any other component on the circuit board needing to be cooled.

Another example of how the liquid can be directed over the electronic components will be referred to herein as controlled flow. In controlled flow, means are provided to contain the liquid as it flows over the electronic component, so that more of the liquid contacts the component, thereby enhancing the effectiveness of the liquid cooling. In the illustrated example, the means to contain the liquid flow comprise plenums that are disposed over the electronic component.

With reference to FIGS. 1, 4, 5, 6a and 6b, a plenum 60 for use with the processor 40b is illustrated. The plenum 60 is a structure made of a suitable material, for example plastic or metal, having perimeter side walls 62, a front wall 64 and a partial rear wall 66. At least one inlet port 68 is provided in the perimeter side wall 62 adjacent the top of the plenum 60, with the inlet port 68 being connected to the outlet of the tube 56. In the illustrated example, two inlet ports 68 are provided, each connected to a tube 56. The number of inlet ports 68 and the tubes 56 connected to the inlet ports can vary depending upon the cooling needs of the processor 40b. The bottom side 70 of the plenum 60 is open, through which liquid introduced into the plenum can exit as it flows down toward the sump area 48.

Figure 6A:
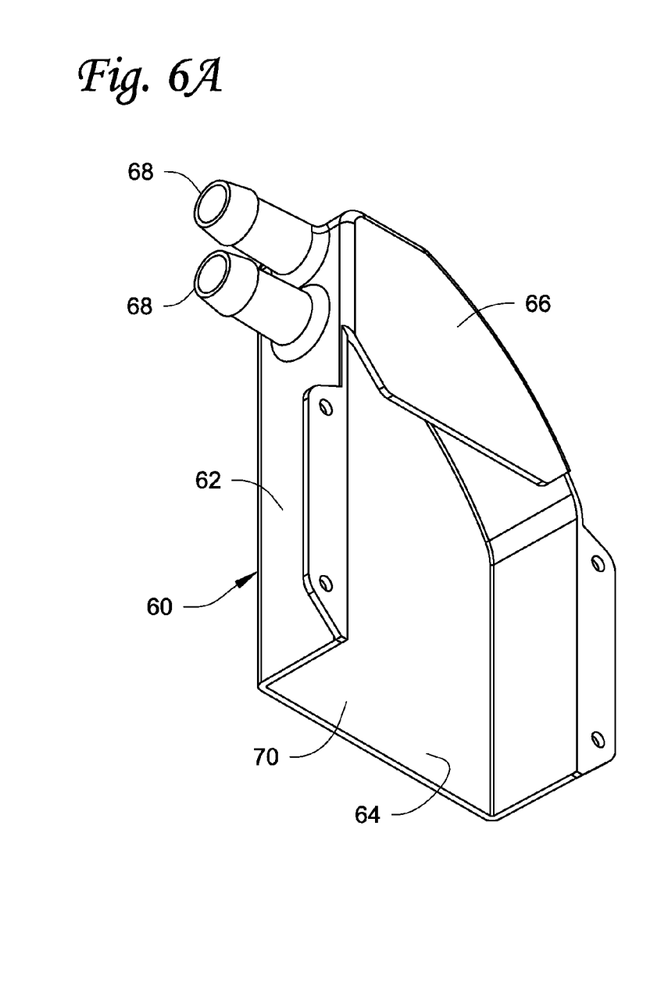
FIG. 6a is a rear perspective view of the processor plenum.
Figure 6B:
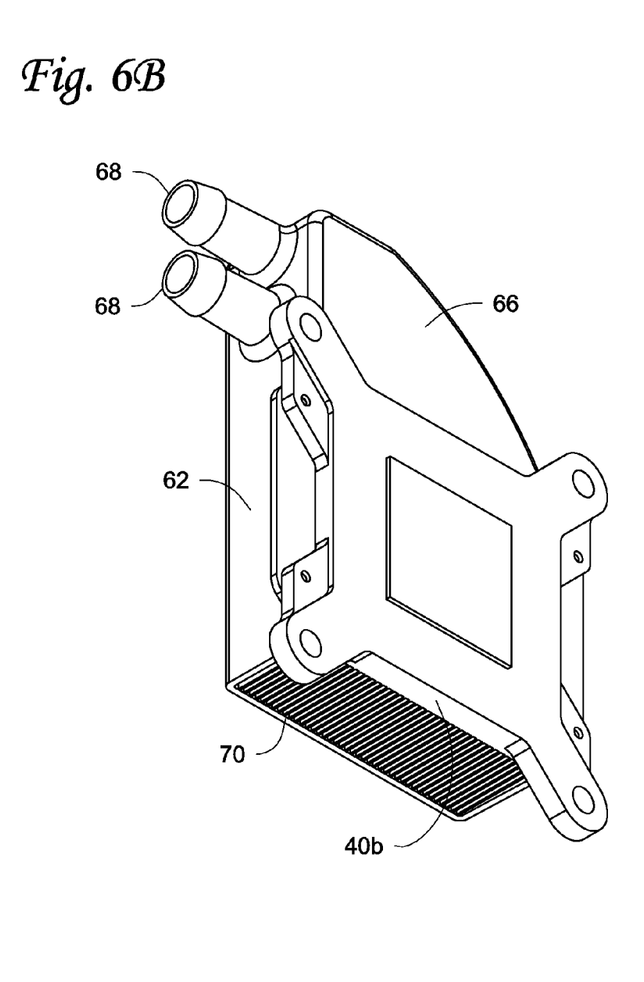
FIG. 6b is a rear perspective view of the processor plenum positioned over the processor.

If determined to be necessary, the processor 40b can be provided with a plurality of cooling fins 72 which are in contact with and direct heat away from the processor 40b and increase the surface area for heat exchange. Similar to the pins 58, the fins 72 help break up the boundary layer to increase the efficiency of heat transfer from the processor 40b. As shown in FIG. 6b, when the plenum 60 is disposed over the processor 40b, the partial rear wall 66 is disposed above the fins 72 and in engagement with the top of the fins, the front wall 64 is positioned closely adjacent to the outer edges and sides of the fins, and the front wall 64 and side walls 62 extend approximately the same distance downward as the bottom of the fins 72. The rear wall 66 helps direct liquid entering the inlet ports 68 to flow down past the processor and through the fins 72.

The processor 40b is relatively closely enclosed by the plenum 60. The plenum 60 helps to contain the liquid as it flows over the processor 40b and the fins 72, so that more of the liquid contacts the processor 40b and the fins 72, thereby enhancing the effectiveness of the liquid cooling. After contacting the processor 40b and fins 72, the liquid exits the plenum 60 through the open bottom side 70.

The plenum 60 need not form a liquid-sealed enclosure over the processor 40b and fins 72, and in the illustrated example does not form a liquid-sealed enclosure. This helps eliminate the need for tight manufacturing tolerances. The plenum 60 should be configured to help contain the liquid as it flows over the processor 40b and fins 72. The amount or degree of flow containment can vary depending upon how much flow containment, and resulting increase in cooling effectiveness, one wishes to achieve.

Figure 7:
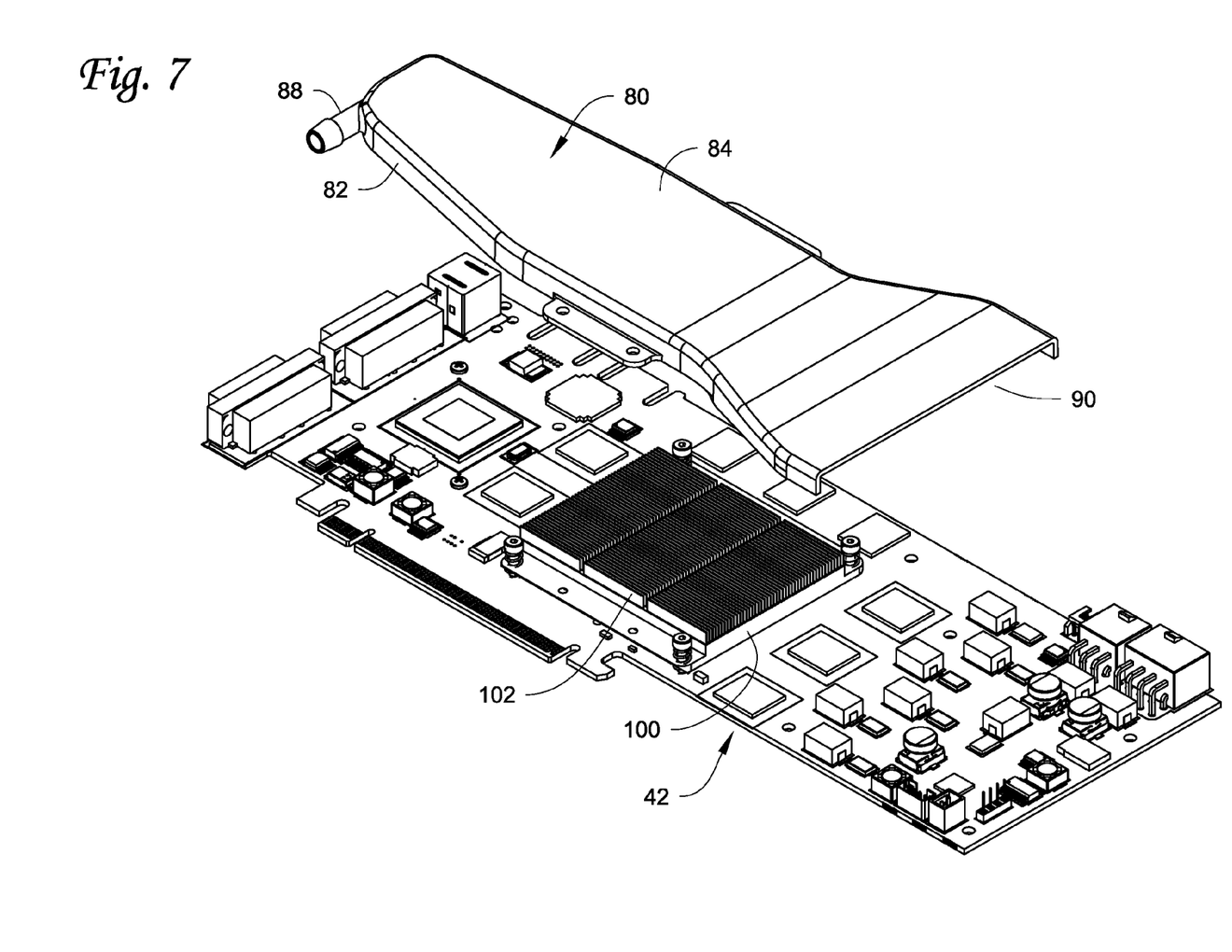
FIG. 7 is an exploded perspective view showing a video card plenum and a video card of the computer.

FIGS. 4 and 7 illustrate a plenum 80 disposed on the video/graphics card 42. The plenum 80 is a structure made of a suitable material, for example plastic or metal, having perimeter side walls 82, a front wall 84 and a partial rear wall (not visible) similar to the rear wall 66. An inlet port 88 is provided in the perimeter side wall 82 adjacent the top of the plenum 80, with the inlet port 88 being connected to the outlet of one of the tubes 56. As with the plenum 60, the plenum 80 can include a plurality of inlet ports depending upon the cooling needs of the processor 40b. The bottom side 90 of the plenum 80 is open, through which liquid introduced into the plenum can exit as it flows down toward the sump area 48.

The video/graphics card 42 includes a graphics processor 100 disposed thereon with optional fins 102 extending from the processor 100 to break up the boundary layer and increase the area for heat transfer. The card 42 also includes other electronic components disposed thereon that are appropriate for a video/graphics card. When the plenum 80 is disposed on the card 42, the processor 100 and fins 102 are relatively closely enclosed by the plenum 80. The plenum 80 helps to contain the liquid as it flows over the processor 100 and the fins 102, so that more of the liquid contacts the processor and the fins, thereby enhancing the effectiveness of the liquid cooling. After contacting the processor and fins, the liquid exits the plenum 80 through the open bottom side 90.

Returning now to FIGS. 1-3, the heat exchange unit 16 is seen to include a radiator 110 that in use is mounted on the rear wall 26 of the case 12. The radiator 110 includes a liquid inlet 112 and a liquid outlet 114. A pump 116 has an inlet connected via an inlet line 118 to an outlet in the bottom wall 28 of the case to draw liquid from the sump area 48. The outlet of the pump is connected to the radiator inlet 112 via a pump outlet line 120. The radiator outlet 114 is connected to the inlet port 52 of the manifold 50 via a return line 122.

Figure 3:
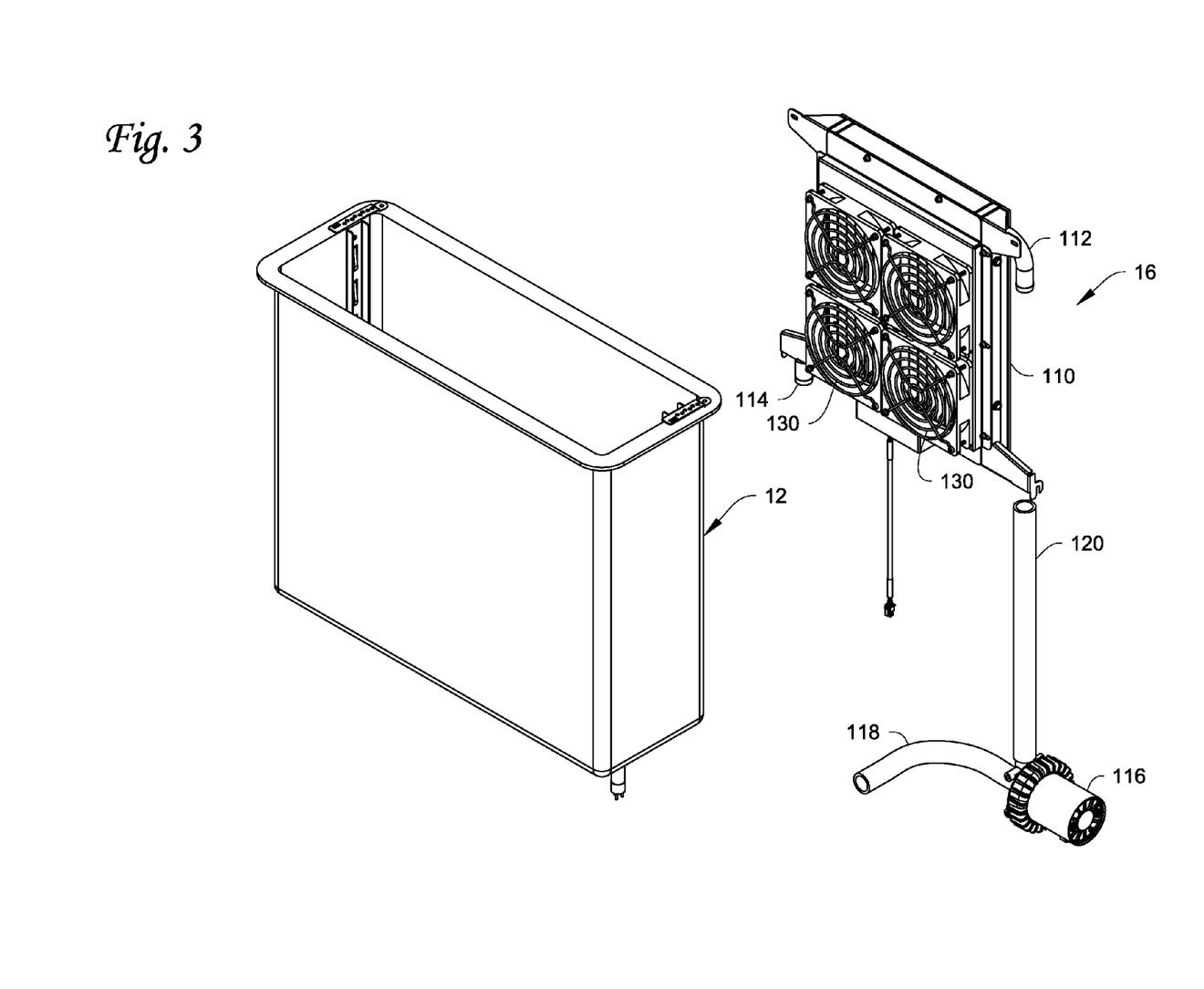
FIG. 3 is an exploded perspective view of the computer case and the heat exchange unit that in use is connected to the case.

The pump that is used can be any type of pump that provides suitable flow of liquid through the system to meet the cooling needs one desires. For example, a pump rated at about 2.0-2.5 gallons per minute has been used successfully. The pump 116 is illustrated as being external to the interior space 30 of the case. However, the pump 116 can be mounted within the interior space 30 or at other locations within the system if desired.

In use, dielectric liquid from the sump area of the case is pumped to the radiator 110. The dielectric liquid is cooled within the radiator, and then returned to the manifold 50 for distribution to the various electronic components via the tubes 56. The dielectric cooling liquid is directed over the various electronic components via uncontrolled flow, controlled flow or combinations thereof. Gravity assists the cooling liquid in flowing over the electronic components, with the liquid picking up heat from the components. The liquid then flows down toward the bottom of the case back to the sump area for return to the radiator. The falling liquid on the electronic components is in counter-direction to the natural buoyant lift that tends to be caused by the heating of the liquid, which has the effect of thinning the thermal boundary layer.

The radiator 110 can be configured to passively cool the liquid passing therethrough via contact between the radiator fins and air. Alternatively, and as illustrated in FIG. 3, air moving means in the form of at least one fan 130 can be provided to positively move air past the radiator. In the example illustrated in FIG. 3, four air moving fans 130 are provided. The fans 130 are mounted on the radiator 110 so they are disposed between the rear wall 26 of the case and the radiator 110 when the radiator is mounted on the case. The fans are shown as being axial flow fans. However, other fan types, such as centrifugal fans, and other number numbers of fans, for example a single fan, can be used.

As indicated above, the front wall 24 can be transparent to allow viewing of the contents within the interior space 30 of the case. Therefore, a viewer will be able to see the dielectric liquid flowing down over the circuit board 14. To enhance the visual effect of the flowing liquid, an optional deflector plate 140 can be mounted on the circuit board as seen in FIGS. 1 and 4. The deflector plate 140 includes an end 142 that is fixed to the circuit board 14 adjacent the memory cards 44, an angled section 144 that angles outwardly from the circuit board in front of the memory cards, and a v-shaped section 146 at the free end of the plate 140. As the dielectric cooling liquid is directed over the electronic components and flows downwardly, some of the liquid flows onto the memory cards 44 and cools the cards. Some of the flowing liquid engages the deflector plate 140, with a portion of liquid flowing to the rear of the plate, and another portion flowing over the front of the plate. The deflector plate 140 helps break up the flow of liquid as it returns to the sump area, helping create a visual effect somewhat similar to a waterfall as the liquid flows over the deflector plate.

As shown in FIGS. 1 and 4, the power supply 46 is positioned under the deflector plate 140. The power supply is also a heat generating component and can benefit from liquid cooling. The power supply is provided with a plurality of deflectors 150 which function to funnel or direct liquid flowing downwardly over the deflector plate 140 into the interior of the power supply. The deflectors 150 are placed at locations on the power supply so that liquid directed into the power supply flows onto a component(s) needing cooling. A larger or smaller number of deflectors 150 can be used, depending upon, for example, the cooling requirements of the power supply. Holes (not visible) in the bottom of the power supply allow the cooling liquid to drain from the power supply into the sump area 48.

The level of cooling liquid collected in the sump area 48 can vary depending upon, for example, how much liquid one wants in the system. For example, the liquid level can be high enough to completely submerge the power supply 46. The liquid level can be just below the power supply 46, yet submerge most or all of the manifold 50. Whatever liquid level one finds suitable for providing enough cooling liquid in the system can be used.

The concepts described may be embodied in other forms without departing from the spirit or novel characteristics thereof. The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A liquid cooled electronic device, comprising:
   one or more electronic components capable of generating heat disposed in an interior space of a liquid-tight container;
   a liquid distribution unit configured to cool at least one of said one or more electronic components by distributing a dielectric liquid to flow in a liquid state over and in direct contact with said at least one electronic component through assistance of gravity so as to absorb heat generated by said at least one electronic component;
   a liquid sump beneath the one or more electronic components configured to receive said liquid that flows off said at least one electronic component, the liquid sump is open to and defined by the interior space;
   the liquid that flows over the at least one electronic component is in the same state as the liquid in the liquid sump;
   a heat exchange unit configured to cool said liquid that is received by said liquid sump; and
   a liquid pumping unit configured to pump said liquid received by said liquid sump through said heat exchange unit for cooling of said liquid and to return said liquid back to said liquid distribution unit so as to reuse said liquid for further cooling of said at least one electronic component.

2. The liquid cooled electronic device of claim 1, wherein the liquid distribution unit comprises a device having an opening for liquid inlet and an opening for liquid outlet and disposed over said at least one electronic component to enclose said at least one electronic component thereby confining the liquid therein as the liquid flows over said at least one electronic component so as to increase contact between the liquid and said at least one electronic component, the device is positioned relative to the at least one electronic component such that liquid exiting the liquid outlet does not flow over the at least one electronic component before the liquid reaches the liquid sump.

3. A method of liquid cooling an electronic component capable of generating heat, comprising:
   distributing a dielectric liquid using a liquid distribution device to flow in a liquid state over and in direct contact with said electronic component through assistance of gravity so as to absorb heat generated by said electronic component;
   receiving said liquid that flows off said electronic component using a liquid sump disposed beneath said electronic component, the liquid sump is open to and defined by an interior space in which the electronic component is disposed;
   the liquid that flows over the electronic component is in the same state as the liquid in the liquid sump;
   cooling said liquid received by said liquid sump using a heat exchange device by flowing said liquid through said heat exchange device; and
   returning said liquid back to said liquid distribution device using a liquid pumping device so as to reuse said liquid for further cooling of said electronic component.

4. The method of claim 3, wherein the flow of the liquid over said electronic component is controlled using a device having an opening for liquid inlet and an opening for liquid outlet and disposed over said electronic component to enclose said electronic component thereby confining the liquid therein as the liquid flows over said electronic component so as to increase contact between the liquid and said electronic component, the device is positioned relative to the electronic component such that liquid exiting the liquid outlet does not flow over the electronic component before the liquid reaches the liquid sump.

* * * * *